United States Patent
Kong et al.

(10) Patent No.: US 8,907,701 B2
(45) Date of Patent: Dec. 9, 2014

(54) CMOS DIFFERENTIAL LOGIC CIRCUIT USING VOLTAGE BOOSTING TECHNIQUE

(71) Applicant: Research & Business Foundation Sungkyunkwan University, Suwon-si (KR)

(72) Inventors: Bai Sun Kong, Seoul (KR); Jong Woo Kim, Seoul (KR); Joo Seong Kim, Seoul (KR)

(73) Assignee: Research & Business Foundation Sungkyunkwan University, Suwon-si (KR)

( * ) Notice: Subject to any disclaimer, the term of this patent is extended or adjusted under 35 U.S.C. 154(b) by 52 days.

(21) Appl. No.: 13/770,546

(22) Filed: Feb. 19, 2013

(65) Prior Publication Data
US 2014/0152342 A1    Jun. 5, 2014

(30) Foreign Application Priority Data
Dec. 4, 2012  (KR) .......................... 10-2012-0139895

(51) Int. Cl.
*H03K 19/096* (2006.01)
*H03K 17/16* (2006.01)
*H03K 19/0185* (2006.01)

(52) U.S. Cl.
CPC .............................. *H03K 19/018528* (2013.01)
USPC .................... 326/98; 326/93; 326/95; 326/33; 327/386; 327/390

(58) Field of Classification Search
USPC .......................... 327/386, 390, 536, 537, 589; 326/93–98, 33, 112, 115, 119, 121, 326/126, 127
See application file for complete search history.

(56) References Cited

U.S. PATENT DOCUMENTS

| 6,014,041 | A  | * | 1/2000  | Somasekhar et al. | ......... | 326/115 |
| 6,956,406 | B2 | * | 10/2005 | Seningen et al.   | ............. | 326/121 |
| 7,928,792 | B2 | * | 4/2011  | Kong et al.       | .................... | 327/333 |
| 8,289,257 | B1 | * | 10/2012 | Simon             | ............................. | 345/99  |

FOREIGN PATENT DOCUMENTS

| KR | 10-0227072 B1 | 10/1999 |
| KR | 10-0725994 B1 | 6/2007  |

OTHER PUBLICATIONS

Kim, Jong-Woo, et al. (Mar. 2012). "Low-Voltage CMOS Differential Logic Style With Supply Voltage Approaching Device Threshold." *IEEE Transactions on Circuits and Systems-II. Express Beliefs.* vol. 59, No. 3; pp. 173-177; 5 pages.
Korean Office Action issued Nov. 1, 2013 in counterpart Korean Application No. 10-2012-0139895. (8 pages including English translation).

* cited by examiner

*Primary Examiner* — Vibol Tan
(74) *Attorney, Agent, or Firm* — NSIP Law (57) ABSTRACT

The present invention discloses a CMOS differential logic circuit. The CMOS differential logic circuit includes a precharge differential logic unit, which is precharged to a source voltage in response to a clock signal and is configured to output voltage having an increased load-driving ability using a boosting voltage; a voltage-boosting unit, which is pulled down by a ground voltage in response to the clock signal and is configured to boost the pulled-down voltage using capacitive coupling and output the boosting voltage; and a switching unit, which is configured to couple the precharge differential logic unit and the voltage-boosting unit in response to the clock signal. The propagation delay of a signal from the input terminal to the output terminal of a circuit in a low-source-voltage environment can be reduced, and the operating speed of the circuit and energy efficiency of the operation thereof can be improved.

10 Claims, 10 Drawing Sheets

FIG. 1

--Prior Art--

FIG. 2

--Prior Art--

| SOURCE VOLTAGE (V) | 0.5 | 0.6 | 0.7 | 0.8 | 0.9 | 1 |
|---|---|---|---|---|---|---|
| DELAY TIME (ns) | 4.8 | 1.7 | 1.0 | 0.6 | 0.5 | 0.4 |
| ENERGY CONSUMPTION (pJ) | 31 | 55 | 79 | 103 | 127 | 152 |

# CMOS DIFFERENTIAL LOGIC CIRCUIT USING VOLTAGE BOOSTING TECHNIQUE

CROSS-REFERENCE TO RELATED APPLICATION

This application claims the benefit under 35 U.S.C. §119 (a) of Korean Patent Application No. 10-2012-0139895, filed on Dec. 4, 2012, in the Korean Intellectual Property Office, the entire disclosure of which is incorporated herein by reference for all purposes.

BACKGROUND

1. Field

The present invention relates to a CMOS differential logic circuit, and more particularly, to a CMOS differential logic circuit using a voltage boosting technique, which is capable of improving operating speed and energy efficiency in a low-source-voltage environment in such a way as to supply a source voltage boosted by the capacitive coupling of a MOS transistor for transferring a signal from an input terminal to an output terminal.

2. Description of the Related Art

The increasing interest in energy-efficient design is provoking a growing need for portable devices that consume energy efficiently.

Since most energy consumption of modern digital CMOS circuits is historically attributable to switching energy dependent on a source voltage, voltage scaling is an effective way to minimize the overall energy consumption of a system-on-chip.

In extreme cases, circuits can be made to operate in a sub-threshold region for maximum energy efficiency. This approach is limited to use only in low-end designs in which operating speed is a secondary concern because of severe speed degradation, attributable to the low switching current, and great performance variability due to changes in process, temperature, and threshold voltage.

In contrast, for medium- and high-end circuits, where both speed performance and energy efficiency are important, extreme voltage scaling is not acceptable, and instead, a near-threshold voltage design is more suitable for achieving relatively high energy efficiency without severe speed degradation.

Figure 1:
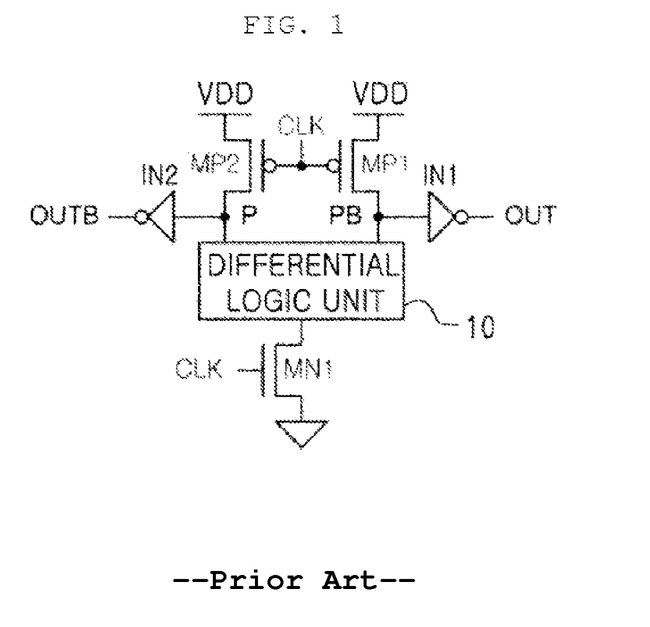
FIG. 1 is a circuit diagram of a conventional differential cascode voltage switch (DCVS) circuit.

FIG. 1 is a circuit diagram of a conventional differential cascode voltage switch (DCVS) circuit. The DCVS circuit includes first and second PMOS transistors MP1 and MP2, a differential logic unit 10, a first NMOS transistor MN1, and first and second inverters IN1 and IN2.

Figure 2:
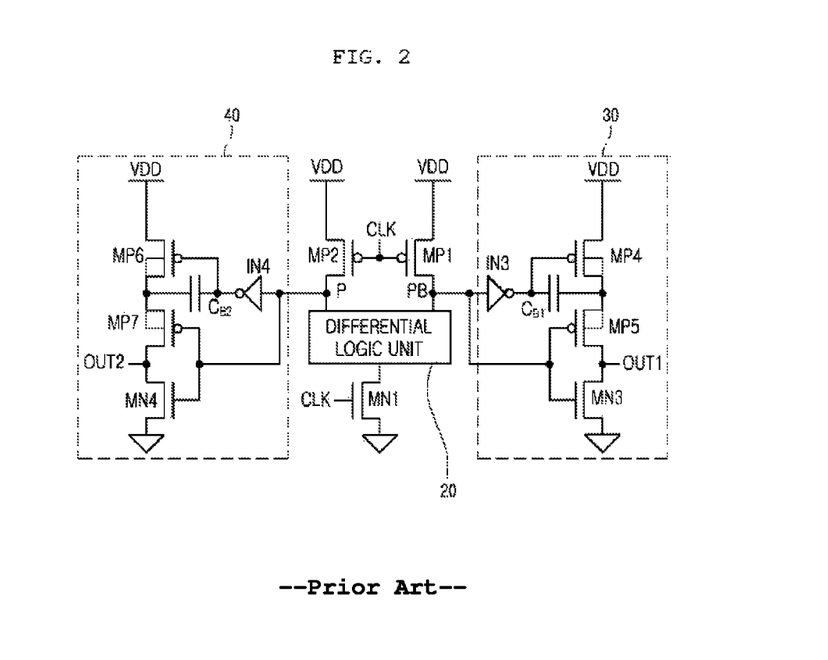
FIG. 2 is a circuit diagram of a conventional bootstrapped dynamic logic (BDL) circuit.

FIG. 2 is a circuit diagram of a conventional bootstrapped dynamic logic (BDL) circuit. The conventional BDL circuit includes first and second PMOS transistors MP1 and MP2, a differential logic unit 20, a first NMOS transistor MN1, and first and second output units 30 and 40.

The first output unit 30 includes a third inverter IN3, fourth and fifth PMOS transistors MP4 and MP5, a third NMOS transistor MN3, and a first bootstrapped capacitor $C_{B1}$. The second output unit 40 includes a fourth inverter IN4, sixth and seventh PMOS transistors MP6 and MP7, a fourth NMOS transistor MN4, and a second bootstrapped capacitor C.

The operations of the conventional DCVS circuit and the conventional BDL are described below with reference to FIGS. 1 and 2.

In general, the switching operating speed of a transistor is greatly influenced by the difference between a gate-source voltage $V_{GS}$ and a threshold voltage $V_{TH}$.

Accordingly, when the source voltage VDD is scaled down, the gate-source voltage $V_{GS}$ drops and the difference between the gate-source voltage $V_{GS}$ and the threshold voltage $V_{TH}$ is gradually reduced because the threshold voltage $V_{TH}$ is fixed. As a result, the operating speed of the transistor is greatly reduced.

That is, in the conventional DCVS circuit of FIG. 1, when the source voltage is scaled down toward the threshold voltage, the operating speed is severely reduced due to the reduction in the overdrive voltage VGS $V_{GS}$-$V_{TH}$ of the transistor.

As described above, the conventional DCVS circuit can operate at high speed because the number of transistors that form the logic and the magnitude of input capacitance are small. The conventional DCVS circuit, however, is problematic in that, like the existing CMOS logic, the operating speed is greatly reduced when the source voltage VDD is scaled down because the output current is proportional to the supplied source voltage VDD.

In order to overcome this problem, a bootstrapped CMOS large capacitive-load driver circuit was proposed. The bootstrapped CMOS large capacitive-load driver circuit can improve switching speed at low source voltages by allowing the voltage of some internal nodes to be boosted beyond the source voltage.

However, since the circuit is used as a large capacitive-load driver, logic functions cannot be efficiently embedded into the circuit.

In order to overcome this limitation, a bootstrapped dynamic logic (BDL) circuit, such as that shown in FIG. 2 for high-speed logic operations at low source voltage, was proposed.

The conventional BDL circuit includes the first and second output units 30 and 40. Precharge and boosting operations are sequentially performed in the first and second output units 30 and 40 in response to changes in the levels of a clock signal CLK and an input signal supplied to the differential logic unit 20.

That is, the first output units 30 is connected to an output terminal OUT1, precharged in response to a low-level clock signal CLK, and boosted by the capacitive coupling of the first bootstrapped capacitor $C_{B1}$ in response to a high-level first input signal and the high-level clock signal CLK supplied to the differential logic unit 20.

The second output units 40 is connected to the differential logic unit 20, precharged in response to the low-level clock signal CLK, and boosted by the capacitive coupling of the second bootstrapped capacitor $C_{B2}$ in response to a second high-level input signal and the high-level clock signal CLK supplied to the differential logic unit 20.

As described above, since the conventional BDL circuit must use two large-capacitive bootstrapped capacitors, the operating speed of this logic style is not improved much due to the addition of the overall latency of the circuit.

Furthermore, the logic composition of this logic style is constrained since this logic style is configured as a single-ended structure.

In addition, although some recent circuit techniques adopting bootstrapped operation have been proposed, they are not all for logic composition. Some are for large capacitance driving.

As described above, the conventional BDL reduces the problems with the existing circuits in which the operating speed is reduced according to the reduction in scale of the source voltage VDD by outputting voltage higher than the source voltage VDD by way of capacitive coupling.

However, the two large-capacitive bootstrapped capacitors must be used in the output terminal of the circuit in order to boost the output voltage, and the size of the transistors that form the logic must be increased in order to rapidly drive the output of this structure. Accordingly, there is a problem in that energy consumption is also increased in proportion thereto.

Meanwhile, the importance of low consumption power design has greatly increased due to the growth of portable electronic devices that employ limited energy sources such as batteries.

As an effective design technique for low power consumption, there is a method of scaling down source voltage VDD. When the source voltage VDD is scaled down, the energy consumption of a system can be reduced because the energy consumption of transistors that form the system is reduced in proportion to the square of the source voltage VDD.

When the source voltage VDD is scaled down, however, there is a problem in that the operating speed of the system is reduced because the operating speed of the transistor is sharply reduced.

In order to solve this problem, there is a need for a circuit capable of operating at high speed even at a low source voltage.

SUMMARY

Accordingly, the present invention has been made in an effort to solve the problems occurring in the related art and an object of the present invention is to provide a CMOS differential logic circuit using a voltage boosting technique which is capable of preventing reduction in operating speed by outputting voltage higher than source voltage even in a low-source-voltage environment according to a capacitive-coupling-based boosting technique and improving energy efficiency for high-speed operation by using only one bootstrapped capacitor.

In order to achieve the above object, according to one aspect of the present invention, there is provided a CMOS differential logic circuit using a voltage boosting technique, including a precharge differential logic unit precharged to a source voltage in response to a clock signal and configured to output voltage having an increased load-driving ability by using a boosting voltage; a voltage-boosting unit pulled down by a ground voltage in response to the clock signal and configured to boost the pulled-down voltage by using capacitive coupling and output the boosting voltage; and a switching unit configured to couple the precharge differential logic unit and the voltage-boosting unit in response to the clock signal.

The precharge differential logic unit includes first and second PMOS transistors, each configured to receive the source voltage through one terminal, turned on in response to low-level of the clock signal, and configured to transfer the source voltages to first and second output nodes PB and P through the other terminals, respectively; and a differential logic tree precharged to the source voltage and configured to transfer the precharged voltage to the switching unit and increase inter-electrode voltages of first switching elements included in the differential logic tree by the boosting voltage.

The precharge differential logic unit further includes a first inverter driver configured to invert the level of the voltage received from the first output node PB and output the voltage having the inverted level and a second inverter driver configured to invert the level of the voltage received from the second output node P and output the voltage having the inverted level.

The first switching elements are NMOS transistors, and the inter-electrode voltages are gate-source voltages.

The switching unit includes a first NMOS transistor having one terminal connected to the precharge differential logic unit and the other terminal connected to the voltage-boosting unit.

The voltage-boosting unit includes a third PMOS transistor configured to receive the source voltage through one terminal, turned on in response to low-level of the clock signal, and configured to transfer the source voltage to a first node NS connected to the other terminal of the third PMOS transistor; a second NMOS transistor configured to receive a ground voltage through one terminal, turned on in response to high-level voltage at the first node NS, and transfer the ground voltage to a second node NP connected to the other terminal of the second NMOS transistor; a third NMOS transistor configured to have one terminal connected to the ground voltage, turned on in response to high-level of the clock signal, and pull down the source voltage transferred to the first node NS connected to the other terminal of the third PMOS transistor; and a bootstrapped capacitor configured to have one terminal connected to the first node NS and the other terminal connected to the second node NP and boosted by the boosting voltage in response to high-level of the clock signal, wherein the second node NP is connected to the other terminal of the switching unit.

The boosting voltage is lower than 0 V.

The voltage-boosting unit reduces the delay time attributable to the low source voltage by increasing the voltage at the second node NP by the boosting voltage.

The voltage-boosting unit increases the load driving abilities of the first and second inverter drivers by increasing the inter-electrode voltages of second switching elements included in the first and second inverter drivers.

The second switching elements are PMOS transistors, and the inter-electrode voltages of the second switching elements are gate-source voltages.

BRIEF DESCRIPTION OF THE DRAWINGS

The above objects, and other features and advantages of the present invention, will become more apparent after a reading of the following detailed description taken in conjunction with the drawings, in which.

DETAILED DESCRIPTION

Reference will now be made in greater detail to a preferred embodiment of the invention, an example of which is illustrated in the accompanying drawings. Wherever possible, the same reference numerals will be used throughout the drawings and the description to refer to the same or like parts.

An exemplary embodiment of a CMOS differential logic circuit using a voltage boosting technique (BCDL) in accordance with the present invention is described below with reference to the accompanying drawings.

Figure 3:
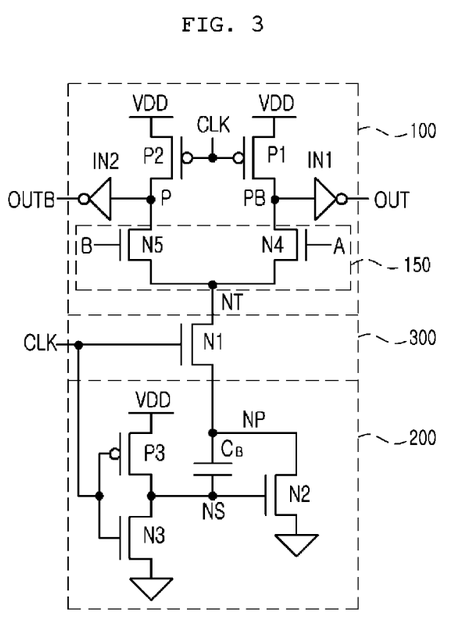
FIG. 3 is a circuit diagram of a CMOS differential logic circuit using a voltage boosting technique in accordance with the present invention.

FIG. 3 is a circuit diagram of a CMOS differential logic circuit using a voltage boosting technique in accordance with the present invention. The CMOS differential logic circuit includes a precharge differential logic unit 100, a voltage-boosting unit 200, and a switching unit 300.

The precharge differential logic unit 100 includes first and second PMOS transistors P1 and P2, a differential logic tree 150, and first and second inverter drivers IN1 and IN2. The differential logic tree 150 includes fourth and fifth NMOS transistors N4 and N5.

The voltage-boosting unit 200 includes a third PMOS transistor P3, second and third NMOS transistors N2 and N3, and a bootstrapped capacitor $C_B$.

The switching unit 300 includes a first NMOS transistor N1.

The operation of each of the blocks of the CMOS differential logic circuit using a voltage boosting technique in accordance with the present invention is described below with reference to FIG. 3.

The precharge differential logic unit 100 is differentially precharged to a source voltage VDD in response to a clock signal CLK. The precharge differential logic unit 100 outputs voltage having increased load-driving ability by using a boosting voltage.

The voltage-boosting unit 200 is pulled down by a ground voltage in response to the clock signal CLK. The voltage-boosting unit 200 boosts the pulled-down voltage by employing a capacitive-coupling-based boosting technique and outputs the boosting voltage.

The switching unit 300 has one terminal connected to the precharge differential logic unit 100 and the other terminal connected to the voltage-boosting unit 200. The switching unit 300 couples the precharge differential logic unit 100 and the voltage-boosting unit 200 in response to the high-level clock signal CLK.

Figure 4:
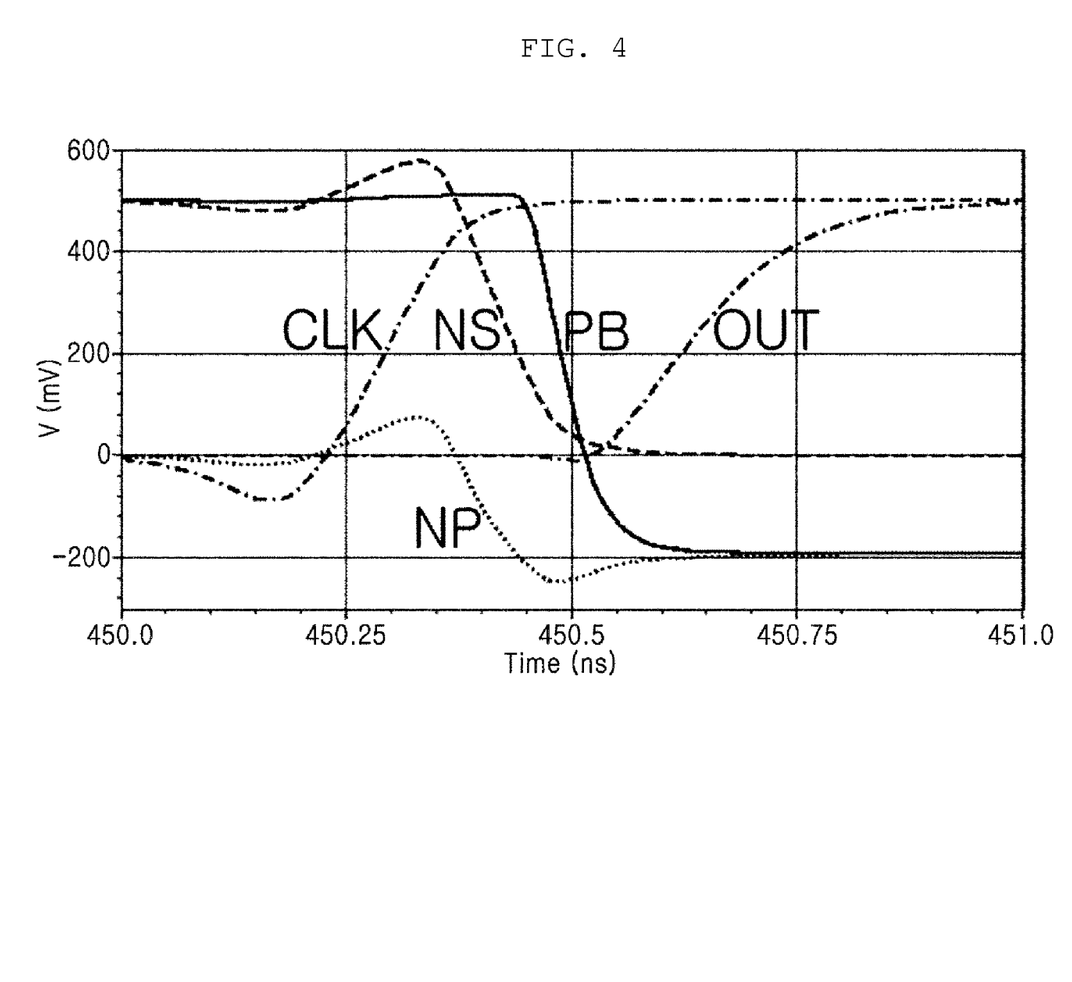
FIG. 4 shows resulting waveforms simulated during the boosting phase of the CMOS differential logic circuit using a voltage boosting technique in accordance with the present invention.

FIG. 4 shows resulting waveforms simulated during the boosting phase of the CMOS differential logic circuit using a voltage boosting technique in accordance with the present invention. In FIG. 4, CLK indicates the clock signal, NS indicates a signal on one terminal of the bootstrapped capacitor $C_B$, NP indicates a signal on the other terminal of the bootstrapped capacitor $C_B$, PB indicates a signal on the other terminal of the first PMOS transistors P1, and OUT indicates an output signal.

The operation of the CMOS differential logic circuit using a voltage boosting technique in accordance with the present invention is described below with reference to FIGS. 3 and 4.

In general, the switching operation speed of a transistor is greatly influenced by the difference between a gate-source voltage $V_{GS}$ and a threshold voltage $V_{TH}$. In a digital circuit, the gate-source voltage $V_{GS}$ of a transistor is the same as the source voltage VDD.

Accordingly, when the source voltage VDD drops, the gate-source voltage $V_{GS}$ drops and the difference between the gate-source voltage $V_{GS}$ and the threshold voltage $V_{TH}$ is reduced because the threshold voltage $V_{TH}$ is fixed. As a result, the operating speed of the transistor is greatly reduced.

If the magnitude of the gate-source voltage $V_{GS}$ can be increased when the transistor performs a switching operation, a reduction in the switching speed of the transistor resulting from the dropped source voltage VDD can be prevented.

Based on this principle, the CMOS differential logic circuit in accordance with the present invention significantly improves the operating speed at low voltage by using a voltage boosting technique in which the gate-source voltages $V_{GS}$ of the transistors are increased by capacitive coupling.

That is, the operation of the CMOS differential logic circuit in accordance with the present invention can be divided into a precharge phase, in which the clock signal CLK is at a low level, and a boosted evaluation phase, in which the clock signal CLK is at a high level.

At this time, a first input signal A at a high level is supplied to the gate terminal of the fourth NMOS transistor N4 of the differential logic tree 150 and a second input signal B at a low level is supplied to the gate terminal of the fifth NMOS transistor N5 of the differential logic tree 150.

First, in the precharge phase, since the clock signal CLK is at a low level, the precharge differential logic unit 100 and the voltage-boosting unit 200 are fully blocked by the first NMOS transistor N1.

At this time, the first and the second PMOS transistors P1 and P2 of the precharge differential logic unit 100 are turned on in response to the source voltages VDD supplied to respective first terminals thereof. The source voltages VDD are transferred to respective nodes PB and P connected to the other terminals of the first and the second PMOS transistors P1 and P2, thus precharging the first and the second PMOS transistors P1 and P2. Next, the source voltages VDD are inverted by the first and second inverter drivers IN1 and IN2. As a result, the output terminals OUT and OUTB of the precharge differential logic unit 100 output respective low-level signals At the same time, the third PMOS transistor P3 of the voltage-boosting unit 200 is turned on in response to the low-level clock signal CLK, and thus voltage at a node NS connected to one terminal of the bootstrapped capacitor $C_B$ is precharged to a high level. The second NMOS transistor N2 receives a ground voltage through one terminal and transfers the ground voltage to a node NP, connected to the other terminal of the bootstrapped capacitor $C_B$, in response to the high-level voltage at the node NS.

Accordingly, the source voltage VDD is supplied to both terminals of the bootstrapped capacitor $C_B$.

As shown in FIG. 4, when the clock signal CLK shifts to a high level, the boosted evaluation phase is entered. Since the clock signal CLK is at a high level, the precharge differential logic unit 100 and the voltage-boosting unit 200 are coupled by the first NMOS transistor N1.

In the boosted evaluation phase, the third NMOS transistor N3 of the voltage-boosting unit 200 is turned on in response to the high-level clock signal CLK. As a result, voltage at the node NS connected to one terminal of the bootstrapped capacitor $C_B$ is pulled down to a low level, and voltage at the node NP connected to the other terminal of the bootstrapped capacitor $C_B$ is boosted by the capacitive coupling of the bootstrapped capacitor $C_B$, thus dropping to a boosting voltage lower than 0 V.

Here, if the voltage at the node NS connected to one terminal of the bootstrapped capacitor $C_B$ is excessively pulled down the voltage of the node NS may be controlled using parasitic capacitors.

From FIG. 4, it can be seen that in the voltage-boosting unit 200 voltage at the node NP connected to the other terminal of the bootstrapped capacitor $C_B$ drops to −250 mV, which is less than 0 V, due to the boosting operation and remains at −200 mV.

Meanwhile, when the boosting voltage of the node NP connected to the other terminal of the bootstrapped capacitor $C_B$ is supplied to one terminal of the first NMOS transistor N1, the first NMOS transistor N1 transfers the boosting voltage to a node NT connected to the differential logic tree 150 in response to the high-level clock signal CLK.

In response thereto, the gate-source voltages $V_{GS}$ of the fourth and the fifth NMOS transistors N4 and N5, that is, first switching elements included in the differential logic tree 150, rise by the boosting voltage. As a result, the load driving abilities of the first NMOS transistor N1 and the differential logic tree 150 are increased.

Furthermore, since a weak forward bias is supplied to the source-body of the transistor, the threshold voltage of the transistor is reduced, thereby further increasing the load driving abilities of the first NMOS transistor N1 and the differential logic tree 150.

In response to the input of the differential logic tree 150, either the node P or the node PB is connected to the node NT, and thus the node P or the node PB outputs voltage boosted to 0 V or lower. In the present embodiment, since the first input signal A of a high level is supplied to the gate terminal of the fourth NMOS transistor N4 of the differential logic tree 150, the fourth NMOS transistor N4 is turned on, and thus the output node PB is connected to the node NT. As a result, as shown in FIG. 4, voltage at the output node PB is pulled down and output as voltage that has been boosted to 0 V or lower from a high level.

The gate-source voltages $V_{GS}$ of PMOS transistors (not shown), which are second switching elements included in the first and the second inverter drivers IN1 and IN2, are increased and the load driving abilities of the first and the second inverter drivers are increased.

Accordingly, the propagation delay of a signal from the input terminal to the output terminal of the CMOS differential logic circuit in accordance with the present invention can be reduced. As a result, the switching speed of the circuit in a low voltage region can be significantly improved.

Figure 5:
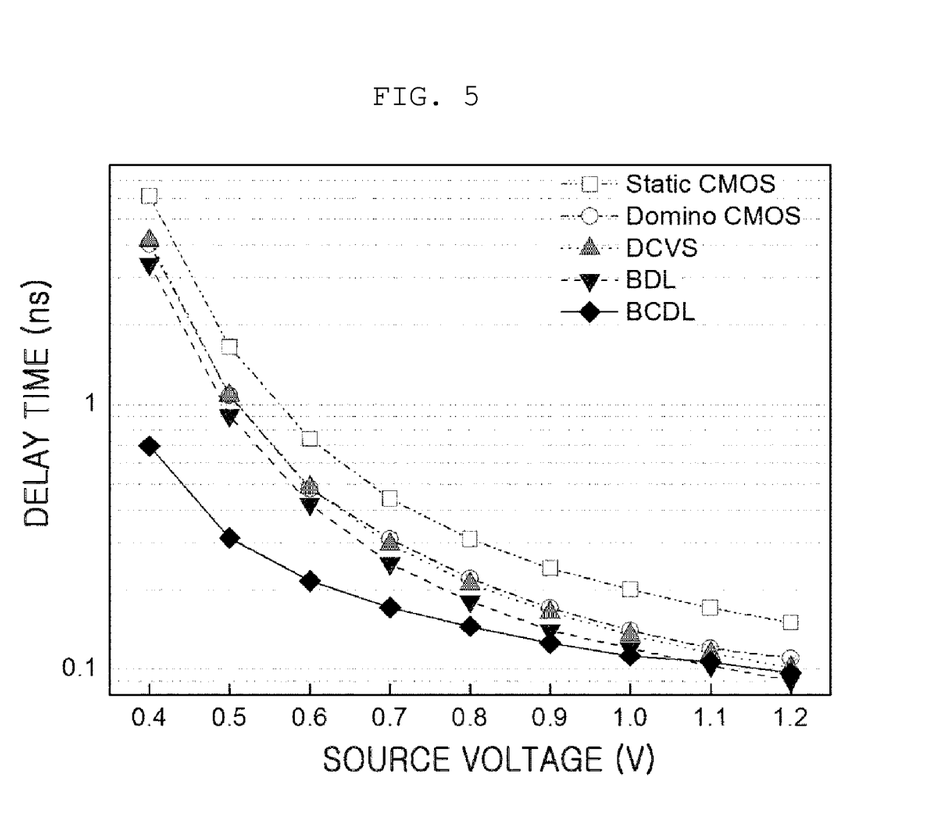
FIG. 5 is a graph showing the results of a comparison between a simulated delay time according to a source voltage VDD that is supplied to the CMOS differential logic circuit using a voltage boosting technique in accordance with the present invention and those of the existing logic circuits.

FIG. 5 is a graph showing the results of a comparison between a simulated delay time according to the source voltage VDD, which was supplied to the CMOS differential logic circuit using a voltage boosting technique in accordance with the present invention and those of existing logic circuits. The results were obtained through simulations conducted while changing the source voltage VDD from 0.4 V to 1.2 V by 0.1 V in a 0.18 µm CMOS process.

Figure 6:
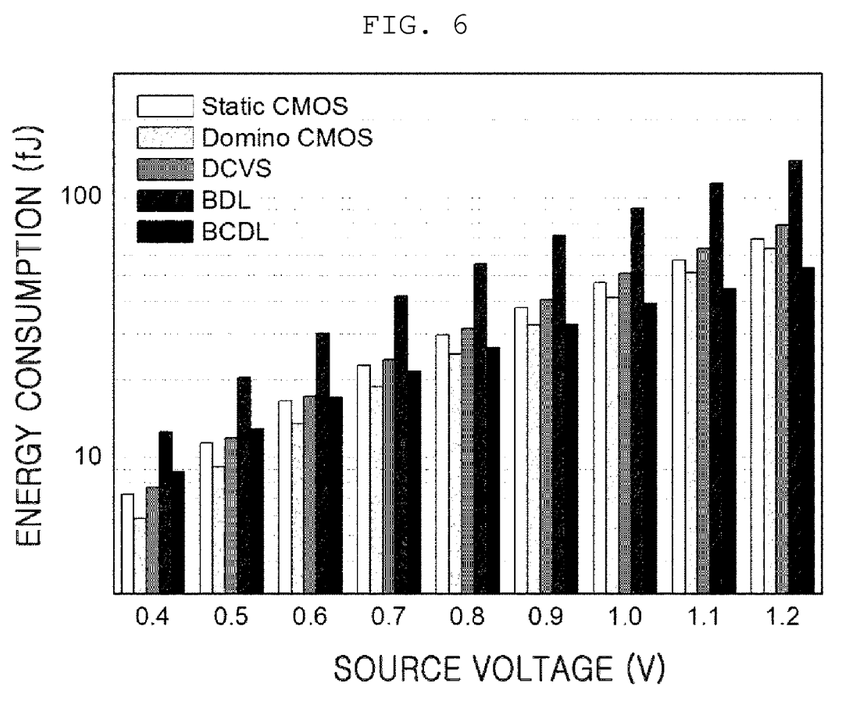
FIG. 6 is a graph showing the results of a comparison between energy consumption according to a source voltage VDD that is supplied to the CMOS differential logic circuit using a voltage boosting technique in accordance with the present invention and those of the existing logic circuits.

FIG. 6 is a graph showing the results of a comparison between energy consumption according to a source voltage VDD which was supplied to the CMOS differential logic circuit using a voltage boosting technique in accordance with the present invention and those of existing logic circuits.

Figure 7:
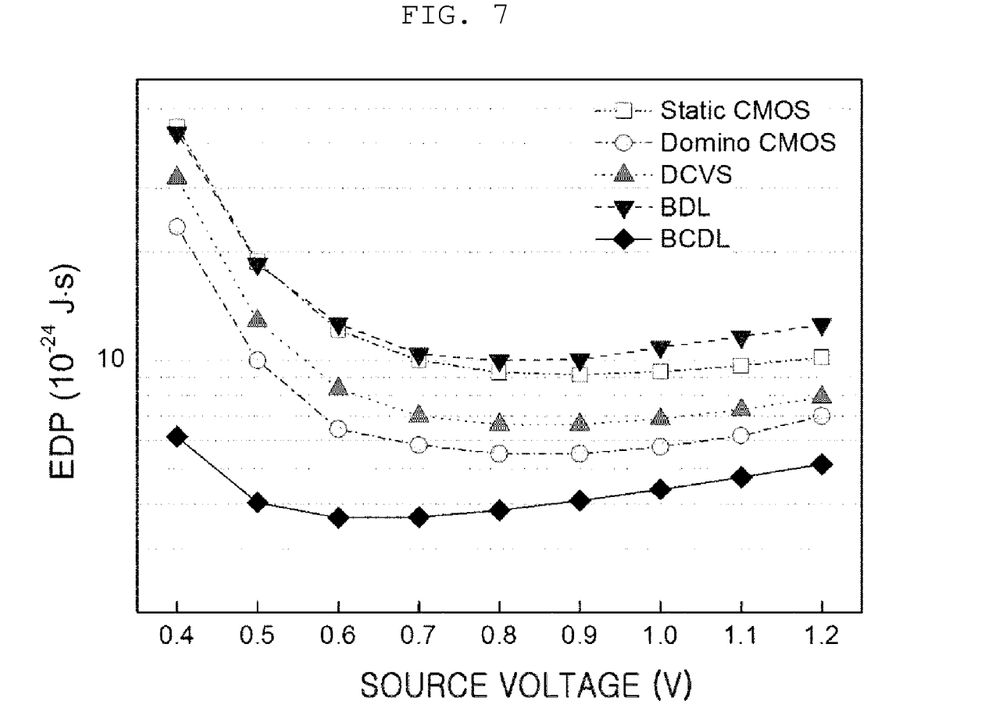
FIG. 7 is a graph showing the change in an energy delay product (EDP) according to a source voltage VDD that was multiplied by the results shown in FIGS. 5 and 6 and then supplied.

FIG. 7 is a graph showing the change in an energy delay product (EDP) according to a source voltage VDD that was multiplied by the results shown in FIGS. 5 and 6 and supplied.

From FIG. 5, it can be seen that as the source voltage VDD drops from 1.2 V to 0.4 V near a threshold voltage, a difference between the CMOS differential logic circuit using a boosting technique and the existing logic circuits is gradually increased and, at 0.4 V, the CMOS differential logic circuit using a boosting technique has the delay time reduced by 89%, 82%, 83%, and 79% as compared to the existing static CMOS logic, domino CMOS logic, DCVS logic, and BDL, respectively.

From FIG. 6, it can be seen that at the same source voltage VDD, the CMOS differential logic circuit using a boosting technique shows energy consumption similar to that of the existing static CMOS logic, domino CMOS logic, and DCVS logic but not to the existing BDL which consumes the greatest amount of energy.

From FIG. 7, it can be seen that at all source voltage (VDD) levels the EDP (i.e. the product of energy consumption and delay time which is an index of the energy efficiency of a logic circuit) of the CMOS differential logic circuit using a boosting technique is the smallest and, at 0.4 V, the CMOS differential logic circuit using a boosting technique provides an EDP improved by 86%, 74%, 81%, and 86% as compared to the existing static CMOS logic, domino CMOS logic, DCVS logic, and BDL, respectively.

Figure 8:
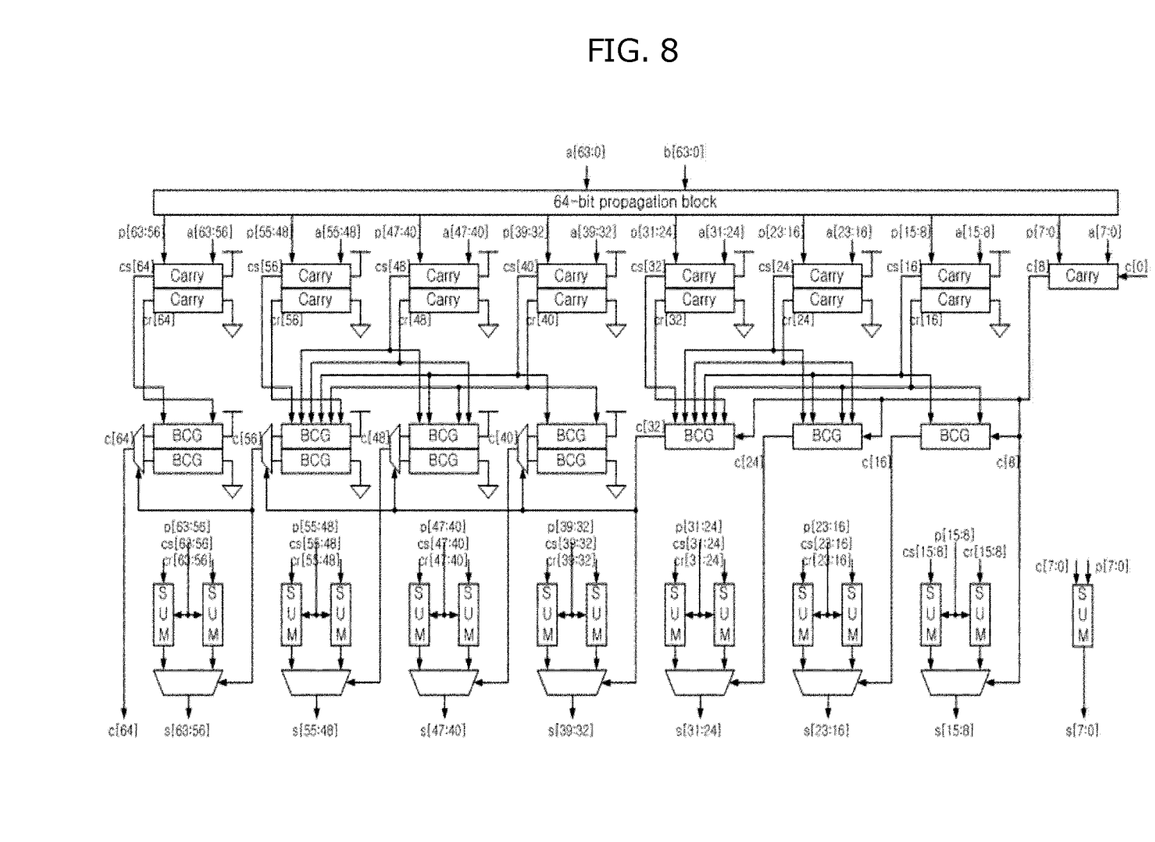
FIG. 8 is a circuit diagram of 64-bit adders that were designed using DCVS logic, BDL, and BCDL in the 0.18 µm CMOS process of the CMOS differential logic circuit using a voltage boosting technique in accordance with one embodiment of the present invention.

FIG. 8 is a circuit diagram of 64-bit adders that were designed using DCVS logic, BDL, and BCDL in a 0.18 µm CMOS process of the CMOS differential logic circuit using a voltage boosting technique in accordance with one embodiment of the present invention.

Figure 9:
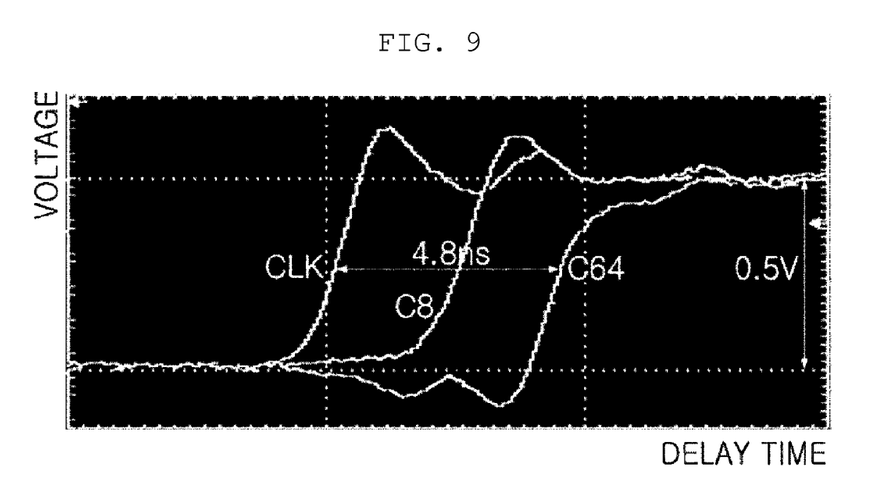
FIG. 9 shows resulting waveforms of chip test delay times of the 64-bit adders of FIG. 8 in accordance with one embodiment of the present invention.
Figure 10:
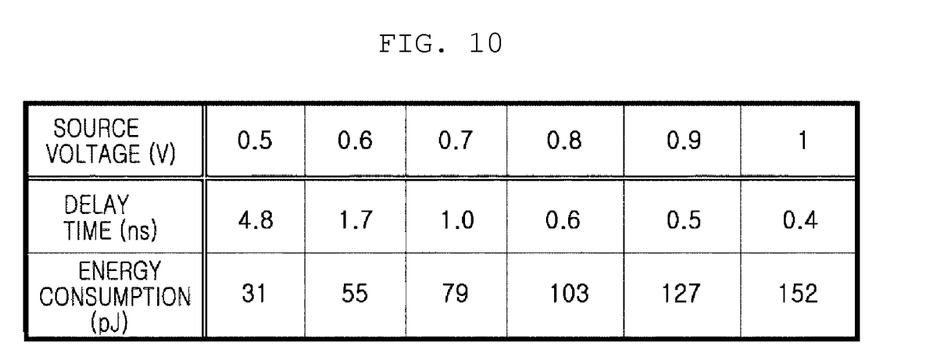
FIG. 10 is a table showing the chip test results of delay time and energy consumption according to the source voltage VDD of the 64-bit adders of FIG. 8 in accordance with one embodiment of the present invention.

FIG. 9 shows resulting waveforms of chip test delay time of the 64-bit adders of FIG. 8 in accordance with one embodiment of the present invention, and FIG. 10 is a table showing the chip test results of delay time and energy consumption according to the source voltage VDD of the 64-bit adders of FIG. 8 in accordance with one embodiment of the present invention.

From FIG. 9, it can be seen that the 64-bit adders show a delay of 4.8 ns at 0.5 V as a result of the chip test which, as the simulation result, approaches 4.69 ns. From FIG. 10, it can be seen that the 64-bit adders show significantly improved performance compared with the existing logic circuits in a low voltage environment and thus can significantly increase low voltage system performance and have an effect of being capable of reducing the product of energy consumption and delay time of a system.

As described above, the CMOS differential logic circuit using a voltage boosting technique in accordance with the present invention can prevent reductions in operating speed by outputting voltage higher than a source voltage even in a low-source-voltage environment by employing a capacitive-coupling-based boosting technique, and can reduce the propagation delay of a signal from the input terminal to the output terminal in a low-source-voltage environment by reducing the product of energy consumption and delay time for a high-speed operation using only one bootstrapped capacitor. As a result, there are advantages in that the operating speed of a circuit and the energy efficiency of the operation thereof can be improved because the switching speed of the circuit is improved.

In accordance with the present invention, there are advantages in that the load-driving ability of an inverter driver at an output terminal can be improved, the threshold voltage of a transistor can be reduced due to a reduced forward bias supplied to the source-body of the transistor, and the load driving abilities of the switching unit and the differential logic tree can be increased due to an increase in the gate-source voltages of the switching elements of the differential logic tree.

Accordingly, there are advantages in that the propagation delay of a signal from the input terminal to the output terminal of the circuit in a low-source-voltage environment can be reduced, and thus the operating speed of a circuit and the energy efficiency of the operation thereof can be improved because the switching speed of the circuit is improved.

Although a preferred embodiment of the present invention has been described for illustrative purposes, those skilled in the art will appreciate that various modifications, additions, and substitutions are possible without departing from the scope and the spirit of the invention as disclosed in the accompanying claims.

What is claimed is:

1. A CMOS differential logic circuit using a voltage boosting technique, comprising:
    a precharge differential logic unit precharged to a source voltage in response to a clock signal and configured to output voltage having an increased load-driving ability by using a boosting voltage;
    a voltage-boosting unit pulled down by a ground voltage in response to the clock signal and configured to boost the pulled-down voltage by using capacitive coupling and output the boosting voltage; and
    a switching unit configured to couple the precharge differential logic unit and the voltage-boosting unit in response to the clock signal.

2. The CMOS differential logic circuit of claim 1, wherein the precharge differential logic unit comprises:
    first and second PMOS transistors configured to receive the source voltage through respective first terminals thereof, turned on in response to low-level of the clock signal, and configured to transfer the source voltages to first and second output nodes through respective second terminals thereof; and
    a differential logic tree precharged to the source voltage and configured to transfer the precharged voltage to the switching unit and increase inter-electrode voltages of first switching elements included in the differential logic tree by the boosting voltage.

3. The CMOS differential logic circuit of claim 2, wherein the precharge differential logic unit further comprises:
    a first inverter driver configured to invert a level of the voltage received from the first output node and output the voltage having the inverted level; and
    a second inverter driver configured to invert a level of the voltage received from the second output node and output the voltage having the inverted level.

4. The CMOS differential logic circuit of claim 2, wherein:
    the first switching elements are NMOS transistors, and
    the inter-electrode voltages are gate-source voltages.

5. The CMOS differential logic circuit of claim 1, wherein the switching unit comprises a first NMOS transistor having a first terminal thereof, connected to the precharge differential logic unit and a second terminal thereof, connected to the voltage-boosting unit.

6. The CMOS differential logic circuit of claim 1, wherein the voltage-boosting unit comprises:
    a third PMOS transistor configured to receive the source voltage through a first terminal, turned on in response to low-level of the clock signal, and configured to transfer the source voltage to a first node connected to a second terminal of the third PMOS transistor;
    a second NMOS transistor configured to receive a ground voltage through a first terminal, turned on in response to high-level voltage at the first node, and transfer the ground voltage to a second node connected to a second terminal of the second NMOS transistor;
    a third NMOS transistor configured to have a first terminal connected to the ground voltage, turned on in response to high-level of the clock signal, and pull down the source voltage transferred to the first node connected to a second terminal of the third PMOS transistor; and
    a bootstrapped capacitor configured to have a first terminal connected to the first node and a second terminal connected to the second node and boosted by the boosting voltage in response to high-level of the clock signal,
    wherein the second node is connected to a second terminal of the switching unit.

7. The CMOS differential logic circuit of claim 1, wherein the boosting voltage is lower than 0 V.

8. The CMOS differential logic circuit of claim 6, wherein the voltage-boosting unit reduces a delay time attributable to a low source voltage by increasing voltage at the second node by the boosting voltage.

9. The CMOS differential logic circuit of claim 3, wherein the voltage-boosting unit increases load driving ability of the first and the second inverter drivers by increasing inter-electrode voltages of second switching elements included in the first and the second inverter drivers.

10. The CMOS differential logic circuit of claim 9, wherein:
    the second switching elements are PMOS transistors, and
    the inter-electrode voltages of the second switching elements are gate-source voltages.

* * * * *